(12) United States Patent
Nozawa

(10) Patent No.: US 9,128,138 B2
(45) Date of Patent: Sep. 8, 2015

(54) ELECTRICAL STORAGE SYSTEM

(71) Applicant: Takashi Nozawa, Nagoya (JP)

(72) Inventor: Takashi Nozawa, Nagoya (JP)

(73) Assignee: TOYOTA JIDOSHA KABUSHIKI KAISHA, Aichi-ken (JP)

( * ) Notice: Subject to any disclaimer, the term of this patent is extended or adjusted under 35 U.S.C. 154(b) by 141 days.

(21) Appl. No.: 14/058,899

(22) Filed: Oct. 21, 2013

(65) Prior Publication Data

US 2014/0111160 A1    Apr. 24, 2014

(30) Foreign Application Priority Data

Oct. 24, 2012    (JP) ................................ 2012-234793

(51) Int. Cl.
| | |
|---|---|
| H02J 7/00 | (2006.01) |
| G01R 31/00 | (2006.01) |
| G01R 31/36 | (2006.01) |
| G01R 19/165 | (2006.01) |

(52) U.S. Cl.
CPC ............ *G01R 31/007* (2013.01); *G01R 31/362* (2013.01); *H02J 7/0026* (2013.01); *G01R 19/16542* (2013.01); *G01R 31/3658* (2013.01); *H02J 7/0014* (2013.01); *Y02T 10/7055* (2013.01)

(58) Field of Classification Search
CPC ..................................................... H02J 7/0016
USPC ......................................................... 320/118
See application file for complete search history.

(56) References Cited

U.S. PATENT DOCUMENTS

| | | | | |
|---|---|---|---|---|
| 8,212,523 | B2 * | 7/2012 | Tatebayashi et al. | ......... 320/118 |
| 2006/0238165 | A1 * | 10/2006 | Moore et al. | .................. 320/118 |

FOREIGN PATENT DOCUMENTS

JP          2010-140785 A          6/2010

* cited by examiner

*Primary Examiner* — Edward Tso
*Assistant Examiner* — Ahmed Omar
(74) *Attorney, Agent, or Firm* — Sughrue Mion, PLLC

(57) ABSTRACT

An electrical storage system includes: serially connected electrical storage blocks each including at least one electrical storage element; a voltage detection circuit connected to each electrical storage block via voltage detection lines; a protection circuit including an overvoltage protection element connected in parallel with each electrical storage block via the voltage detection lines and a first resistor connected in series with the overvoltage protection element; a discharge circuit connected in parallel with each overvoltage protection element via the voltage detection lines and in series with the first resistor, the discharge circuit including a second resistor having a larger resistance value than the first resistor; and a controller detecting an abnormality in the overvoltage protection elements by, while the electrical storage elements are not connected to the load, comparing a voltage of a discharging first electrical storage block with a voltage of a non-discharging second electrical storage block.

4 Claims, 5 Drawing Sheets

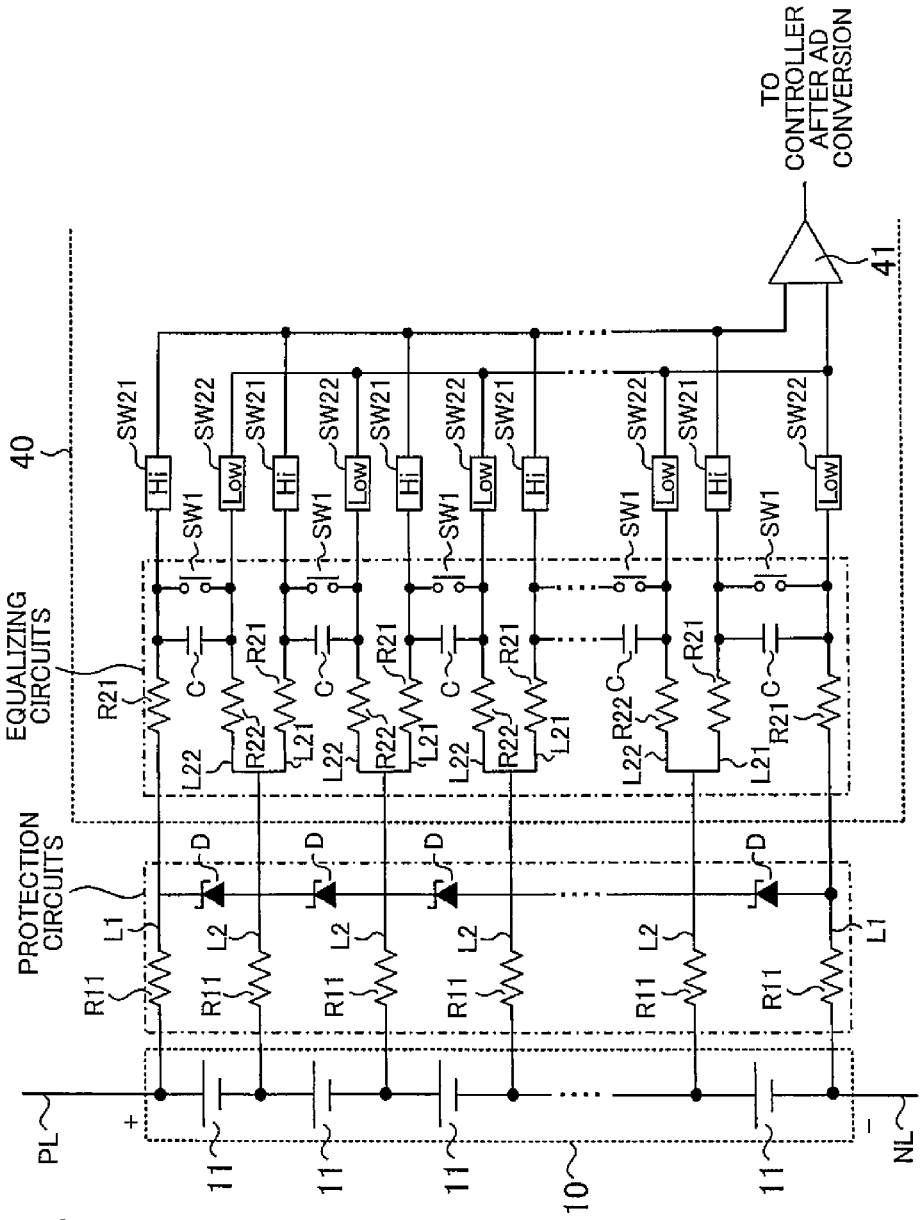
F I G . 2

ELECTRICAL STORAGE SYSTEM

INCORPORATION BY REFERENCE

The disclosure of Japanese Patent Application No. 2012-234793 filed on Oct. 24, 2012 including the specification, drawings and abstract is incorporated herein by reference in its entirety.

BACKGROUND OF THE INVENTION

1. Field of the Invention

The invention relates to a technique for detecting an abnormality in protection circuits each including an overvoltage protection element provided in correspondence with a corresponding one of a plurality of electrically serially connected electrical storage elements.

2. Description of Related Art

In order to avoid a reverse charge state of each single cell, a Zener diode may be electrically connected in parallel with each of a plurality of electrically serially connected single cells. For example, when any one of the single cells enters a reverse charge state, discharging current is caused to flow to a corresponding one of the Zener diodes and to bypass the any one of the single cells. Thus, it is possible to cancel the reverse charge state of the any one of the single cells.

However, when any one of the Zener diodes fails and there occurs an abnormality, leakage current may flow through the any one of the Zener diodes. The voltage of the single cell connected in parallel with the failed Zener diode decreases due to the leakage current, so it is required to detect the abnormality of the Zener diode. In Japanese Patent Application Publication No. 2010-140785 (JP 2010-140785 A), an additional failure detection switching element is provided in a path for charging or discharging a battery in order to detect a failure of an open/close unit (switching element). A failure of the open/close unit is detected by detecting an on/off state of the open/close unit while the failure detection switching element is subjected to on/off control.

In JP 2010-140785 A, another failure detection switching element that is able to undergo on/off control needs to be provided in order to detect a failure. Therefore, a circuit configuration becomes complex, and a failure detection target is limited to the switching element. For example, it is not possible to detect a failure of an element that is used in an overvoltage protection circuit, such as a Zener diode.

SUMMARY OF THE INVENTION

The invention provides an electrical storage system that is able to detect an abnormality in protection circuits each including an overvoltage protection element provided in correspondence with a corresponding one of a plurality of electrically serially connected electrical storage blocks each including an electrical storage element that is charged or discharged.

A first aspect of the invention relates to an electrical storage system. The electrical storage system includes: a plurality of serially connected electrical storage blocks each including at least one electrical storage element connected to a load and configured to be charged or discharged; a voltage detection circuit connected to each of the electrical storage blocks via corresponding voltage detection lines and configured to detect a voltage of each of the electrical storage blocks; a protection circuit including an overvoltage protection element connected in parallel with each of the electrical storage blocks via the corresponding voltage detection lines and a first resistor connected in series with the overvoltage protection element, and the protection circuit being provided in correspondence with each of the electrical storage blocks; a discharge circuit connected in parallel with each of the overvoltage protection elements via the corresponding voltage detection lines and connected in series with the first resistor, the discharge circuit including a second resistor having a larger resistance value than the first resistor; and a controller configured to compare a voltage between the electrical storage blocks using the detected voltages of the corresponding voltage detection circuits and detect an abnormality in the overvoltage protection elements. The controller is configured to detect an abnormality in the overvoltage protection elements by, in a state where the electrical storage elements are not connected to the load, comparing a voltage of a first electrical storage block among the electrical storage blocks, which is placed in a discharged state where current is caused to flow through the corresponding second resistor by activating the corresponding discharge circuit, with a voltage of a second electrical storage block among the electrical storage blocks, which is not placed in the discharged state caused by activating the corresponding discharge circuit.

According to the first aspect of the invention, the resistance value of the second resistor of each discharge circuit is larger than the resistance value of the first resistor of each protection circuit. Therefore, leakage current based on the resistance value of the first resistor and flowing through the abnormal overvoltage protection element is larger than current flowing through a current path via the second resistor connected in parallel with the overvoltage protection element at the time when the corresponding discharge circuit is activated. The amount of decrease in the voltage that decreases due to the leakage current flowing as a result of occurrence of an abnormality in the overvoltage protection element is larger than the amount of decrease in the voltage of the electrical storage block placed in a discharged state by activating the corresponding discharge circuit. Therefore, by comparing a voltage between the electrical storage blocks, it is possible to detect the electrical storage block in which there is an abnormality in the overvoltage protection element and leakage current is flowing, that is, an abnormality of the overvoltage protection element.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 2 is a view that shows the configuration of a battery pack and a voltage monitoring unit according to the first embodiment of the invention;

DETAILED DESCRIPTION OF EMBODIMENTS

Hereinafter, an embodiment of the invention will be described.

First Embodiment

Figure 1:
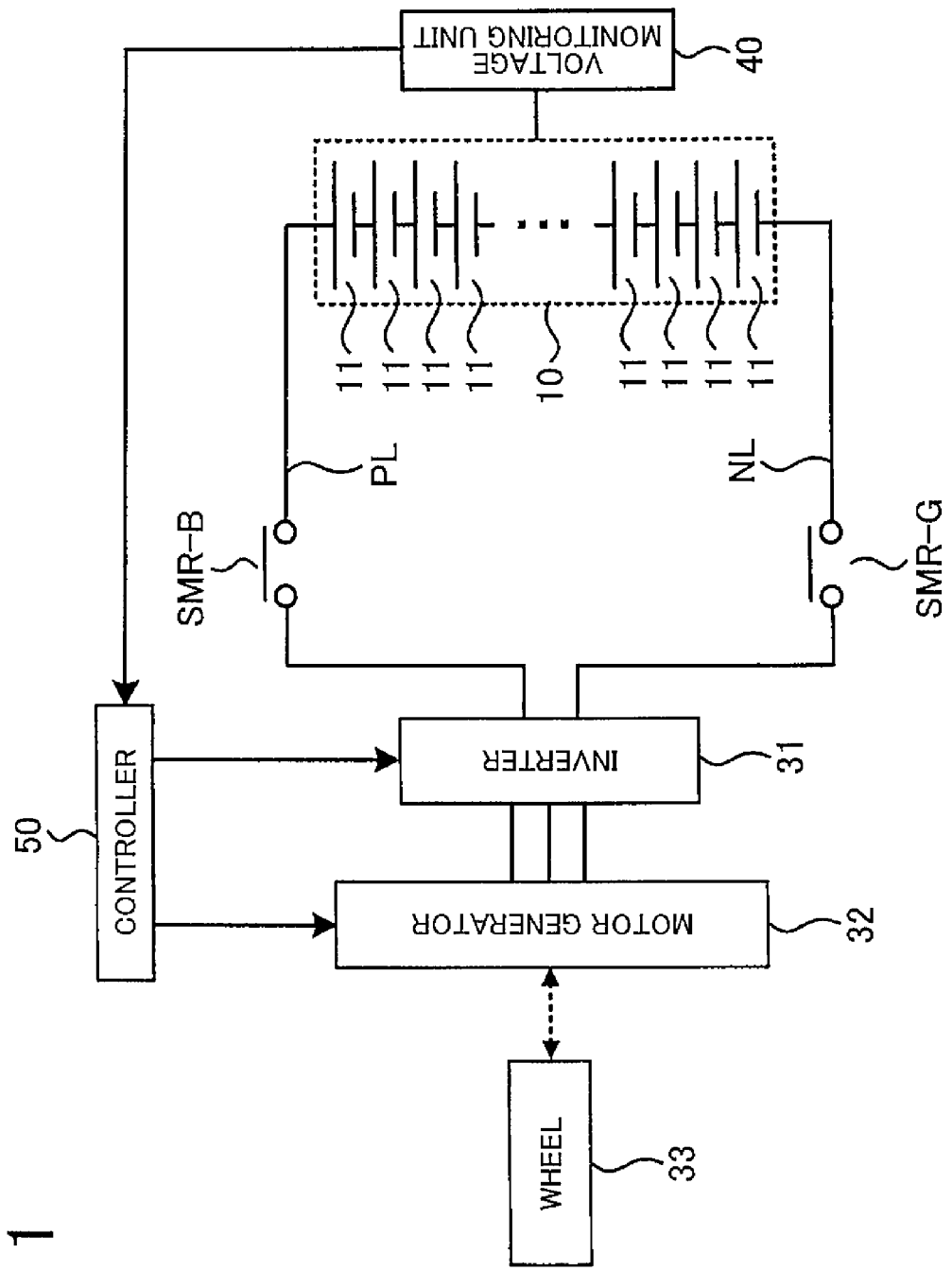
FIG. 1 is a view that shows the configuration of a battery system mounted on a vehicle according to a first embodiment of the invention.

A battery system according to the present embodiment will be described with reference to FIG. 1. FIG. 1 is a schematic view that shows the configuration of the battery system. The battery system according to the present embodiment is mounted on a vehicle. The vehicle may be a hybrid vehicle or an electric vehicle. In the present embodiment, a hybrid vehicle is described as an example. Alternatively, for example, an electric vehicle that includes only a battery system (battery pack) as a power source for propelling the vehicle may be employed.

The battery system includes a battery pack 10. The positive electrode terminal of the battery pack 10 and an inverter 31 are connected to each other via a positive electrode line (cable) PL. The negative electrode terminal of the battery pack 10 and the inverter 31 are connected to each other via a negative electrode line (cable) NL. A system main relay SMR-B is provided in the positive electrode line PL. A system main relay SMR-G is provided in the negative electrode line NL.

The inverter 31 (load) converts direct-current power, supplied from the battery pack 10, to alternating-current power. A motor generator 32 (alternating-current motor) is connected to the inverter 31. The motor generator 32 generates kinetic energy for propelling the vehicle upon reception of the alternating-current power supplied from the inverter 31. The motor generator 32 is connected to a wheel 33. When the vehicle is a hybrid vehicle, an engine (not shown) is connected to the wheel 33, and kinetic energy generated by the engine may be transmitted to the wheel 33. Thus, it is possible to cause the vehicle to travel using the output of the battery pack 10 or the engine.

When the vehicle is decelerated or stopped, the motor generator 32 converts kinetic energy, generated at the time of braking the vehicle, to electric energy (alternating-current power). The inverter 31 converts alternating-current power, generated by the motor generator 32, to direct-current power, and supplies the direct-current power to the battery pack 10. Thus, the battery pack 10 is able to store regenerated electric power. In the case of the hybrid vehicle, in addition to regenerated electric power, electric energy may be stored in the battery pack 10 by driving the motor generator 32 with the use of the engine.

A controller 50 executes drive control over the inverter 31 and the motor generator 32 by outputting control signals respectively to the inverter 31 and the motor generator 32. The controller 50 may include a memory (not shown) that stores various pieces of information. The memory may be provided so as to be incorporated in the controller 50 or may be provided outside the controller 50.

The controller 50 may be provided in correspondence with each of the inverter 31 and the motor generator 32. An additional controller for executing equalizing process (described later) or abnormality detection process for detecting an abnormality in the protection circuits may be provided independently of vehicle control. That is, a central control device that governs control over the entire vehicle may control various portions or an individual controller may be provided in correspondence with each control over a corresponding one of the portions and then the central control device may be individually connected to each controller.

Information about on/off states (IG-ON, IG-OFF) of an ignition switch of the vehicle is input to the controller 30. The controller 50 outputs control signals to the system main relays SMR-B, SMR-G on the basis of the on/off states of the ignition switch. Thus, each of the system main relays SMR-B, SMR-G is switched between the on state and the off state.

When the ignition switch of the vehicle is switched from the off state to the on state, the controller 50 connects the battery pack 10 and the inverter 31 to each other by switching the system main relays SMR-B, SMR-G from the off state to the on state. Thus, the battery system shown in FIG. 1 enters an activated state (ready-on state).

On the other hand, when the ignition switch is switched from the on state to the off state, the controller 50 interrupts connection between the battery pack 10 and the inverter 31 by switching the system main relays SMR-B, SMR-G from the on state to the off state. Thus, the battery system shown in FIG. 1 enters a stopped state (ready-off state).

A current sensor or a temperature sensor (not shown) may be provided in the battery system. The current sensor provided in the current path of the battery pack 10 detects a charging or discharging current flowing through the battery pack 10, and is able to output the detected result to the controller 50. The temperature sensor provided in the battery pack 10 detects the battery temperature of the battery pack 10, and is able to output the detected result to the controller 50.

The controller 50 is able to calculate the state of charge (SOC) of the battery pack 10 on the basis of the detected value of the voltage monitoring unit 40, the current value, and the like, and acquire the output or input power of the battery pack 10. Thus, it is possible to execute charging control or discharging control in response to a vehicle output request.

The battery pack 10 according to the present embodiment is directly connected to the inverter 31; however, the battery pack 10 is not limited to this configuration. Specifically, a step-up circuit may be arranged in the current path between the battery pack 10 and the inverter 31. Thus, the step-up circuit is able to step up the output voltage of the battery pack 10, and supply the stepped-up electric power to the inverter 31. The step-up circuit is also able to step down the output voltage of the inverter 31, and supply the stepped-down electric power to the battery pack 10.

The battery pack 10 is able to be charged with the use of an external power supply. The external power supply is a power supply provided separately from the vehicle outside the vehicle. The external power supply may be, for example, a commercial power supply. When the commercial power supply is used, a charger (not shown) that converts alternating-current power to direct-current power is required. The charger may be provided separately from the vehicle outside the vehicle, and may be added to the battery system shown in FIG. 1.

The voltage monitoring unit 40 detects a voltage value of the battery pack 10 or detects a voltage value of each of single cells 11 included in the battery pack 10. The voltage monitoring unit 40 outputs the detected result to the controller 50. FIG. 2 is a view that shows the configuration of the battery pack 10 and the voltage monitoring unit 40.

As shown in FIG. 2, the battery pack 10 includes the plurality of electrically serially connected single cells (which correspond to electrical storage elements) 11. The number of the single cells 11 that constitute the battery pack 10 may be set as needed on the basis of a required output, or the like, of the battery pack 10. Each single cell 11 may be a secondary battery, such as a nickel metal hydride battery and a lithium ion battery. Instead of the secondary battery, an electric double layer capacitor may be used.

The voltage monitoring unit (which corresponds to voltage detection circuits) 40 is connected to each of the single cells 11 via corresponding two of a plurality of voltage detection lines L1, L2. Although not shown in FIG. 2, switches may be respectively provided in the voltage detection lines L1, L2 located between the voltage monitoring unit 40 and the single cells 11. Each of the switches may be, for example, a photo metal oxide semiconductor (MOS) relay.

The two voltage detection lines L1 are respectively connected to the positive electrode terminal and negative electrode terminal of the battery pack 10. The positive electrode terminal of the battery pack 10 corresponds to the positive electrode terminal of the single cell 11 located at one end in the circuit configuration of the battery pack 10 shown in FIG. 2. The negative electrode terminal of the battery pack 10 corresponds to the negative electrode terminal of the single cell 11 located at the other end in the circuit configuration of the battery pack 10 shown in FIG. 2. Each of the voltage detection lines L2 is connected to the negative electrode terminal of one of the electrically serially connected two adjacent single cells 11 and the positive electrode terminal of the other one of the electrically serially connected two adjacent single cells 11.

A resistor R11 (which corresponds to a first resistor) is provided in each of the voltage detection lines L1, L2. When current larger than an allowable current value flows through any one of the resistors R11, it is possible to interrupt electrical connection between the voltage monitoring unit 40 and the battery pack 10 through melting of the any one of the resistors R11. Thus, it is possible to suppress flow of excessive current from the battery pack 10 (corresponding single cell 11) to the voltage monitoring unit 40.

Zener diodes D are respectively electrically connected in parallel with the single cells 11 via the corresponding two of the voltage detection lines L1, L2. The cathode of each Zener diode D is connected to the positive electrode terminal of a corresponding one of the single cells 11. The corresponding resistor R11 is provided in a current path between the cathode and the positive electrode terminal. The anode of each Zener diode D is connected to the negative electrode terminal of a corresponding one of the single cells 11. The corresponding resistor R11 is provided in a current path between the anode and the negative electrode terminal. Each resistor R11 is connected in series with a corresponding one of the Zener diodes D.

The Zener diodes D are used to suppress application of overvoltage from the battery pack 10 to the voltage monitoring unit 40. That is, when overvoltage is applied from the battery pack 10 to the voltage monitoring unit 40, current flows through any one of the Zener diodes D. Thus, application of overvoltage to the voltage monitoring unit 40 is suppressed. Here, the plurality of Zener diodes D are electrically serially connected to one another.

A resistor R21 is provided in each of the voltage detection lines L1. The resistors R21 are included in the voltage monitoring unit 40. Each pair of resistors R11, R21 are electrically serially connected to each other. The cathode and anode of the corresponding two Zener diodes D are connected to a connection node of the resistors R11, R21.

Each of the voltage detection lines L2 is branched into two branch lines L21, L22 inside the voltage monitoring unit 40. The resistor R21 is provided in each branch line L21. A resistor R22 is provided in each branch line L22.

The pair of resistors R11, R21 are electrically serially connected to each other in each voltage detection line L2. The anode and cathode of the corresponding two Zener diodes D are connected to a connection node of the resistors R11, R21.

In addition, the pair of resistors R11, R22 are electrically serially connected to each other in each voltage detection line L2. The anode and cathode of the corresponding two Zener diodes D are connected to a connection node of the resistors R11, R22.

In each of the voltage detection lines L1, L2, the corresponding resistors R21, R22 or the corresponding resistor R21 (corresponding to a second resistor) is connected in parallel with the corresponding Zener diode D and is connected in series with the corresponding resistor R11 (first resistor).

Here, each of the Zener diodes D in the present embodiment is an overvoltage protection element, and is connected in parallel with a corresponding one of the serially connected single cells 11 via the voltage detection lines L1, L2 or the voltage detection lines L2. Each Zener diode D together with the serially connected resistor R11 (first resistor) constitutes a protection circuit for suppressing application of overvoltage to the voltage monitoring unit 40.

A capacitor (flying capacitor) C and a switch SW1 are connected to the branch line L22 and one of the voltage detection lines L1. Specifically, the capacitor C and the switch SW1 are connected to the voltage detection line L1 located between the resistor R21 and a sampling switch SW21 and the branch line L22 located between the resistor R22 and a sampling switch SW22. The sampling switch SW21 is connected to one of the voltage detection lines L1. The sampling switch SW22 is connected to the branch line L22. In addition, a capacitor (flying capacitor) C and a switch SW1 are connected to the branch line L21 and the other one of the voltage detection lines L1. Specifically, the capacitor C and the switch SW1 are connected to the voltage detection line L1 located between the resistor R21 and a sampling switch SW22 and the branch line L21 located between the resistor R21 and a sampling switch SW21. The sampling switch SW22 is connected to the other one of the voltage detection lines L1. The sampling switch SW21 is connected to the branch line L21.

For any two adjacent voltage detection lines L2 connected to the positive electrode terminal and negative electrode terminal of each single cell 11, a capacitor C and a switch SW1 are connected to the branch line L21 of one of the voltage detection lines L2 and the branch line L22 of the other one of the voltage detection lines L2. Specifically, the capacitor C and the switch SW1 are connected to the branch line L21 located between the resistor R21 and the sampling switch SW21 and the branch line L22 located between the resistor R22 and the sampling switch SW22. Here, the sampling switch SW21 is connected to the branch line L21. The sampling switch SW22 is connected to the branch line L22.

Each of the switches SW1 switches between an on state and an off state upon reception of a control signal from the controller 50. The switches SW1 are used to equalize the voltage values of all the single cells 11 that constitute the battery pack 10.

Specifically, when the voltage value of any one of the single cells 11 is higher than the voltage values of the other single cells 11, it is possible to discharge the any one of the single cells 11 by switching the switch SW1, electrically connected in parallel with the any one of the single cells 11, from the off state to the on state. That is, when the corresponding switch SW1 is turned on, it is possible to allow the discharging current of the any one of the single cells 11 to flow through the resistors R21, R22. As a result, it is possible to decrease the voltage value of the any one of the single cells 11. Thus, it is possible to equalize the voltage value of the any one of the single cells 11 to the voltage values of the other single cells 11.

In the present embodiment, the pairs of resistors R21, R22 (second resistors) are resistors that are respectively connected in parallel with the Zener diodes D via the voltage detection lines L1, L2 and that allow discharging current to flow for equalization. The pair of resistors R21, R22 (second resistor) together with the switch SW1 (equalizing switch) serially connected to the corresponding pair of resistors R21, R22 constitute an equalizing circuit (which corresponds to a discharge circuit). The equalizing circuits according to the present embodiment are provided inside the voltage monitoring unit 40; instead, the equalizing circuits may be provided separately between the voltage monitoring unit 40 and the protection circuits.

Each of the resistors R11 included in each protection circuit and each of the resistors R21, R22 included in each equalizing circuit have a magnitude relation in resistance value. Specifically, each of the resistors R21, R22 has a larger resistance value than each of the resistors R11. The details will be described later.

Each of the capacitors C is electrically connected to a corresponding one of the single cells 11 via the voltage detection lines L1, L2 or the voltage detection lines L2. Therefore, each capacitor C is charged with electric charge stored in the corresponding single cell 11. Thus, the voltage value of each capacitor C becomes equal to the voltage value of the corresponding single cell 11.

The sampling switches SW21, SW22 respectively connected to the positive electrode terminal and negative electrode terminal of each single cell 11 are connected to a comparator 41. Specifically, each sampling switch SW21 is connected to one of input terminals of the comparator 41. Each sampling switch SW22 is connected to the other one of the input terminals of the comparator 41. Here, each of the sampling switches SW21, SW22 switches between an on state and an off state upon reception of a control signal from the controller 50. The plurality of sampling switches SW21, SW22 may be formed of a multiplexer.

When only the sampling switches SW21, SW22 corresponding to any one of the single cells 11 are turned on, the comparator 41 outputs the voltage value of the any one of the single cells 11 (the voltage value of the capacitor C corresponding to the any one of the single cells 11). In this way, by sequentially turning on the pairs of sampling switches SW21, SW22, corresponding to the single cells 11, it is possible to sequentially detect the voltage values of the single cells 11. An output signal of the comparator 41 is subjected to AD conversion and is then input to the controller 50. Thus, the controller 50 is able to detect the voltage of each single cell 11.

Next, detection of an abnormality in the protection circuits according to the present embodiment will be described. In the battery pack 10 in which the plurality of single cells 11 are electrically serially connected to one another, a voltage (in other words, an SOC) may vary among the plurality of single cells 11 through charging and discharging operations of the battery pack 10. Therefore, the equalizing circuits are provided in the battery system. The controller 50 discharges the high-voltage-side single cell 11 by activating the corresponding equalizing circuit. Thus, variations in voltage among the single cells 11 are suppressed.

Figure 3:
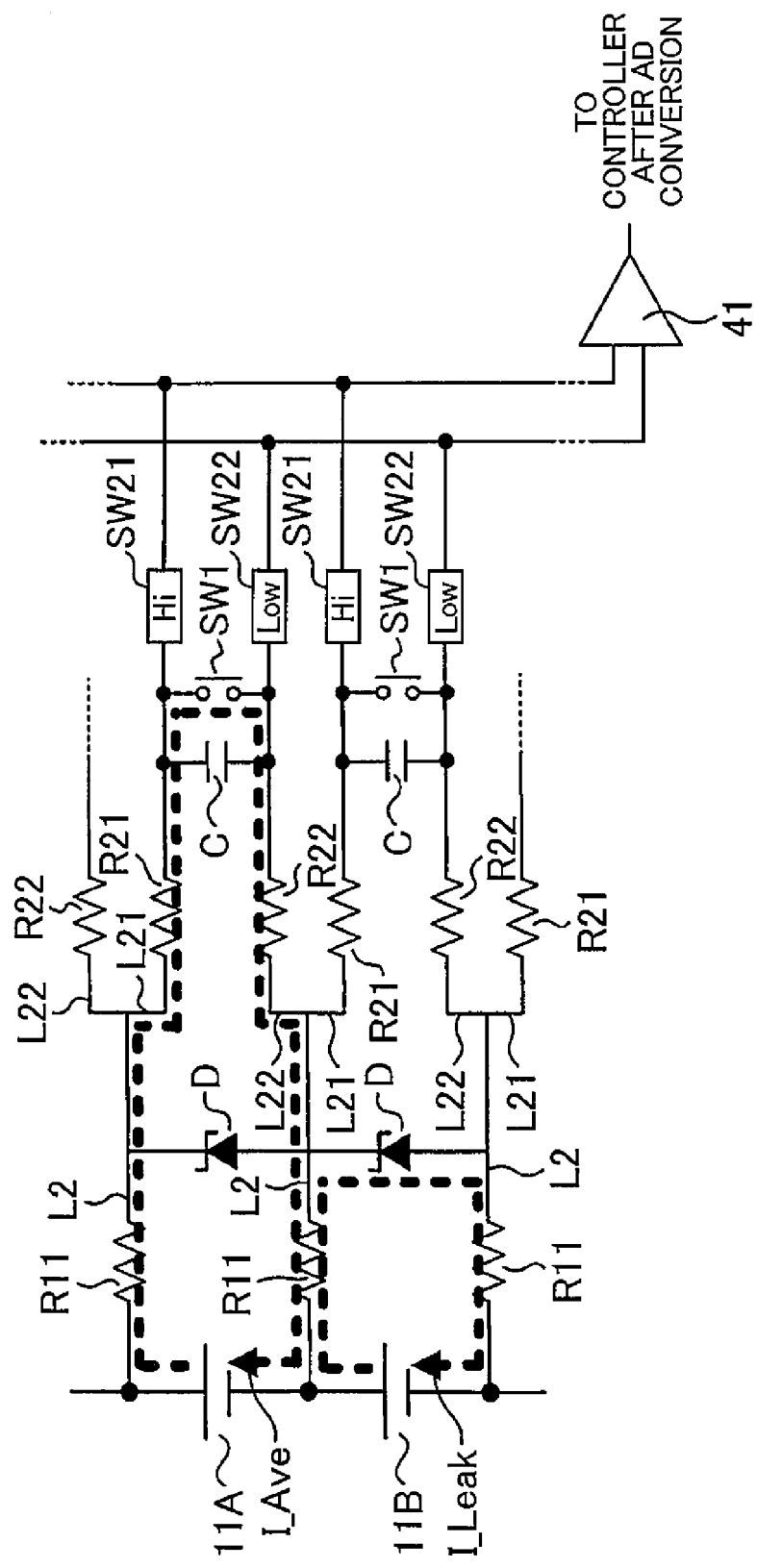
FIG. 3 is a view for illustrating leakage current that occurs due to an abnormality in protection circuits according to the first embodiment of the invention and discharging current caused through equalization.

However, in the configuration shown in FIG. 2, when any one of the Zener diodes D fails, leakage current I_Leak flows through the Zener diode D electrically connected in parallel with the single cell 11B in the direction indicated by the arrow in FIG. 3. In this case, the single cell 11B enters a discharged state, stored electric energy decreases, and the voltage of the single cell 11B decreases.

At this time, the voltage of the single cell 11B (which corresponds to a second electrical storage block) of which the corresponding Zener diode D has failed becomes lower than that of the other single cell 11A of which the corresponding Zener diode D has not failed, and there occur variations in voltage between the single cells 11A, 11B. As a result, the controller 50 carries out discharging operation by activating the equalizing circuit of the single cell 11A in response to a predetermined voltage difference between the single cells 11A, 11B. In this way, the controller 50 executes equalizing process so as to equalize the voltage of the single cell 11A (which corresponds to a first electrical storage block) to the voltage of the single cell 11B.

However, the single cell 11B enters a discharged state due to leakage current as described above, so, for example, the voltage of the single cell 11A is decreased so as to follow the voltage of the single cell 11B, which continues decreasing due to flow of leakage current. As a result, rather suppression of variations in voltage, the voltage (SOC) of the single cell 11A may be decreased more than necessary. Therefore, it is necessary to detect a failure in the Zener diodes D.

In the present embodiment, the resistance value of the resistor R21 (or the resistor R22) in each equalizing circuit including the resistor R21 (or the resistor R22) connected in parallel with each Zener diode D is set so as to be larger than the resistance value of the resistor R11 connected in series with the Zener diode D in each protection circuit connected to the corresponding single cell 11 via the voltage detection lines L1, L2 (or the voltage detection lines L2).

That is, the resistance value of each resistor R21 (or each resistor R22) of each equalizing circuit is set so as to be larger than the resistance value of each resistor R11 of each protection circuit. Thus, the following result is obtained. That is, it is possible to set the leakage current I_Leak based on the resistance value of the resistor R11 flowing through the abnormal Zener diode D such that the leakage current I_Leak is larger than a discharging current I_Ave flowing through the current path via the resistor R21 (or the resistor R22) connected in parallel with the Zener diode D at the time when the corresponding equalizing circuit is activated.

Thus, a power consumption of the single cell 11B for which the leakage current I_Leak flows through the corresponding Zener diode D is larger than a power consumption through equalization of the single cell 11A for which no leakage current I_Leak flows through the corresponding Zener diode D. As a result, while the equalizing process is executed due to variations in voltage between the single cells 11A, 11B as a result of flow of the leakage current I_Leak, the voltage difference between the single cells 11A, 11B gradually increases with a lapse of time.

In other words, the equalizing process is a process of suppressing variations in voltage among the single cells 11. The voltage of the single cell 11B of which the corresponding Zener diode D has failed is lower than the voltage of the single cell 11A of which the corresponding Zener diode D has not failed. Therefore, it is possible to determine the likelihood of a failure of each Zener diode D through the equalizing process. In the present embodiment, the resistance value of the resistor R21 (or the resistor R22) of each equalizing circuit is larger than the resistance value of each resistor R11 of each protection circuit. As a result, a current value of the leakage current I_Leak flowing through the Zener diode D is larger than an equalizing current value of the single cell 11A for which no leakage current I_Leak flows through the corresponding Zener diode D. Therefore, the voltage difference between the single cells 11A, 11B gradually increases with a lapse of time. An abnormality in the Zener diodes D is detected by capturing the above phenomenon.

The resistance value of each resistor R11 included in each protection circuit and the resistance value of the resistor R21 (or the resistor R22) included in each equalizing circuit larger than the resistance value of each resistor R11 may be specified to values such that it is possible to detect an abnormality of each Zener diode D when leakage current larger than or equal to a certain current value flows through the Zener diode D. At this time, the resistance value of the resistor R21 (the resistor R22) may be set to a value larger than the resistance value of each resistor R11 and based on discharge capacity (for example, voltage decrease rate per unit time) of the equalizing process.

Figure 4:
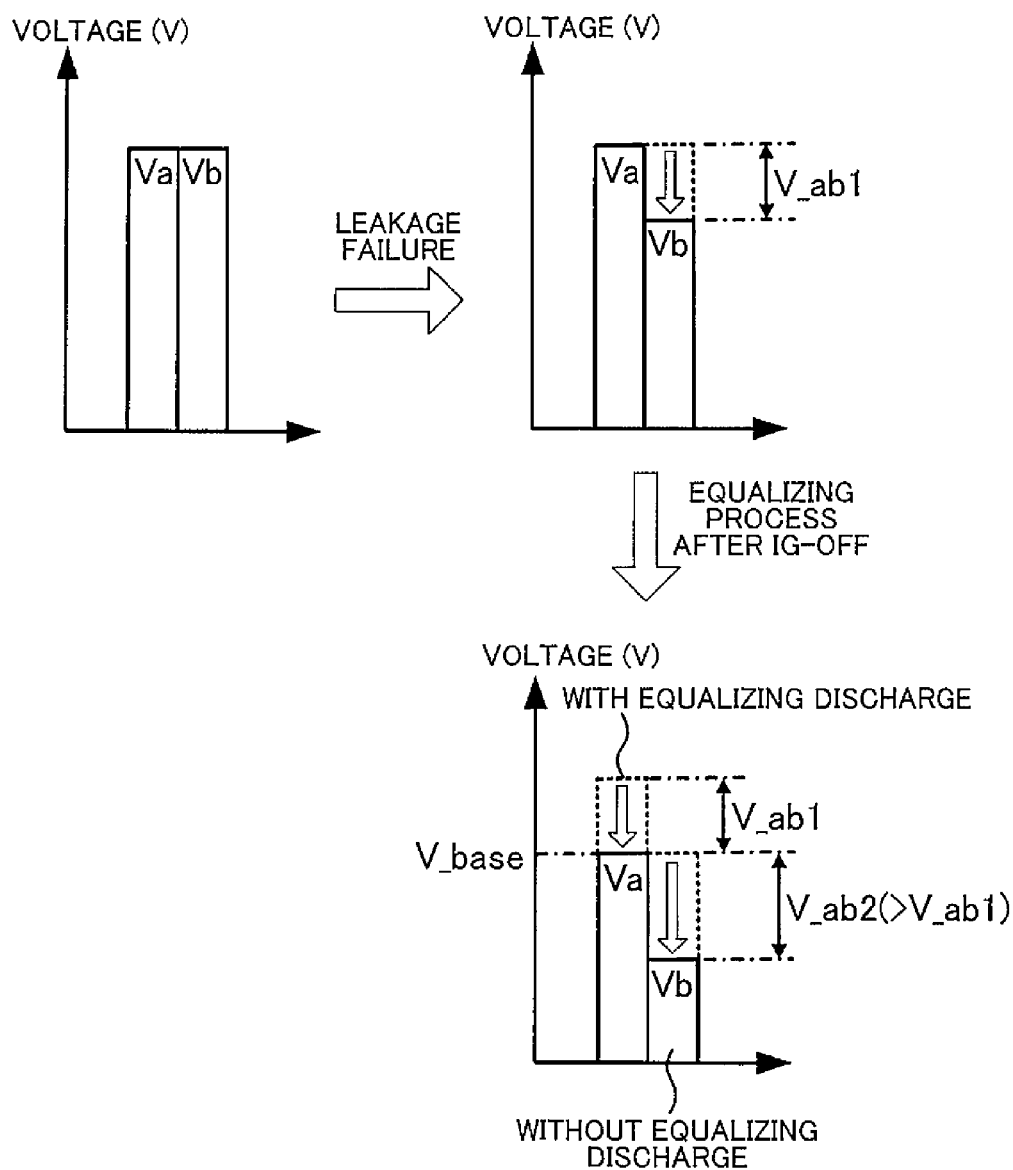
FIG. 4 is a view for illustrating detection of an abnormality in the protection circuits according to the first embodiment of the invention.

FIG. 4 is a view for illustrating detection of an abnormality in the protection circuits according to the present embodiment. As shown in FIG. 4, when there is no abnormality that leakage current flows through the Zener diode D (leakage abnormality), a voltage Va of the single cell 11A and a voltage Vb of the single cell 11B are, for example, the same voltage value.

When there occurs a leakage abnormality that leakage current flows through the Zener diode D connected in parallel with the single cell 11B, the voltage Vb continues decreasing with respect to the voltage Va. Thus, there occurs a voltage difference between the voltage Va and the voltage Vb.

When the voltage difference between the voltage Va and the voltage Vb becomes larger than a voltage difference V_ab1 at which a preset equalizing process is executed, the controller 50 switches the switch SW1 of the single cell 11A from the off state to the on state. Thus, discharging current is caused to flow through the resistors R21, R22 by activating the corresponding equalizing circuit. At this time, the controller 50, for example, calculates a period of time during which discharging current is caused to flow by setting the voltage Vb at the timing, at which the equalizing process is started, as a target value (V_base). The controller 50 is able to execute control so as to cause discharging current to flow through the resistors R21, R22 by activating the corresponding equalizing circuit for the calculated period of time.

The voltage Va of the single cell 11A for which the equalizing circuit is activated decreases toward the target value (V_base). On the other hand, the voltage Vb of the single cell 11B for which there is a leakage abnormality in the Zener diode D decreases due to the leakage current I_Leak flowing through the Zener diode D even in a state where the corresponding equalizing circuit is not activated (the corresponding switch SW1 is in the off state). The voltage of the single cell 11B decreases at a higher decrease rate than the voltage value that decreases through the equalizing process of the single cell 11A.

The controller 50 acquires the voltages of the single cells 11A, 11B during the equalizing process at a predetermined time interval, and obtains the voltage difference between the single cells 11A, 11B. At the timing at which the voltage difference between the single cells 11A, 11B has exceeded a preset threshold V_ab2, it is possible to detect that the Zener diode D connected to the single cell 11B is in an abnormal state. The threshold V_ab2 may be, for example, set to a value larger than the voltage difference V_ab1 at which the preset equalizing process is executed.

Figure 5:
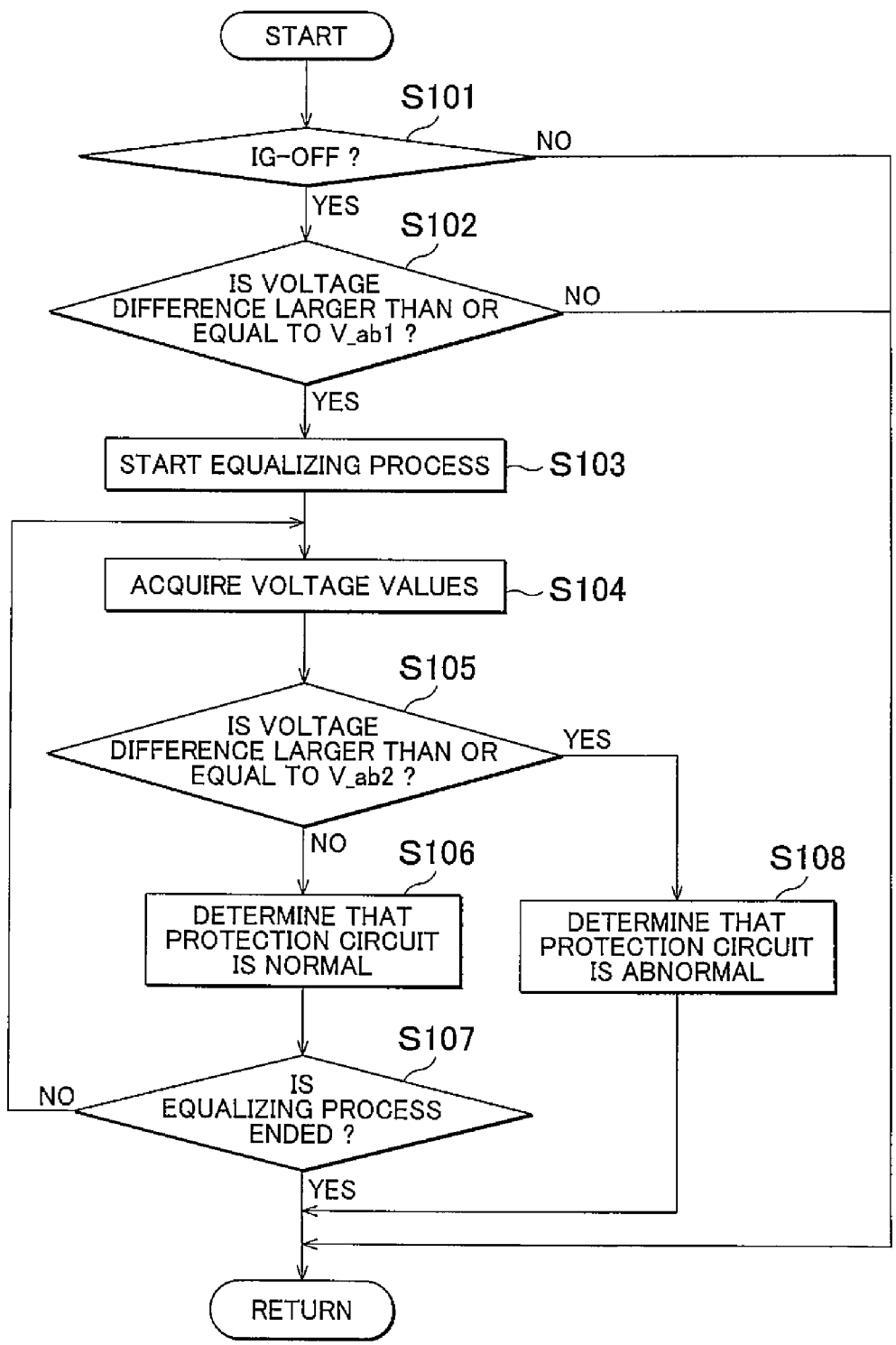
FIG. 5 is a flowchart that shows an abnormality detection process of detecting an abnormality in the protection circuits according to the first embodiment of the invention.

FIG. 5 is a flowchart that shows the process flow of an abnormality detection process of detecting an abnormality in the protection circuits according to the present embodiment. The abnormality detection process is executed by the controller 50. In the present embodiment, the abnormality detection process is executed together with the equalizing process (during the equalizing process) executed by the controller 50.

As shown in FIG. 5, the controller 50 determines whether the ignition switch of the vehicle is in the off state (S101). The equalizing process is executed in a state where the battery pack 10 is not connected to the load (the system main relays SMR-B, SMR-G are in the off state), that is, in a situation that the single cells 11 are not charged or discharged and there are substantially no voltage fluctuations.

When the ignition switch is off, the controller 50 acquires the voltage of each single cell 11 from the voltage monitoring unit 40, and determines whether there is the voltage difference V_ab1, at which the preset equalizing process is executed, among the single cells 11 (S102). When there is no voltage difference V_ab1 among the single cells 11, the equalizing process (abnormality detection process) is ended.

When the controller 50 determines in step S102 that there is the voltage difference V_ab1 among the single cells 11, the controller 50 executes the equalizing process (S103). The controller 50 identifies the single cell 11 having a low voltage value among the single cells 11 having a voltage difference on the basis of the voltage values acquired from the voltage monitoring unit 40, and activates the equalizing circuits of the single cells 11 having a high voltage value. At this time, the controller 50 executes control such that the equalizing circuits other than the equalizing circuit of the single cell 11 having a low voltage value are activated and the equalizing circuit of the single cell 11 having a low voltage value is not activated.

The controller 50 acquires the voltage values of all the single cells 11 at a predetermined time interval after the equalizing process is started (S104). The controller 50 monitors whether the voltage value of each single cell 11 has reached the target value (V_base). The activation of the equalizing circuit corresponding to the single cell 11 of which the voltage value has reached the target value is ended. On the other hand, the activation of the equalizing circuit corresponding to the single cell 11 of which the voltage value has not reached the target value is continued.

Furthermore, the controller 50 calculates a voltage difference between the voltage value of the single cell 11 having a low voltage value, that is, the single cell 11 of which the equalizing circuit is not activated, and the voltage value of any other one of the single cells 11 using the acquired voltage values. The controller 50 determines whether the voltage difference between the voltage value of the single cell 11 (second electrical storage block) of which the equalizing circuit is not activated and the voltage value of the single cell 11 (first electrical storage block) of which the equalizing circuit is activated has exceeded the threshold V_ab2 (S105).

When the controller 50 determines that the voltage difference between the voltage value of the single cell 11 of which the equalizing circuit is not activated and the voltage value of the single cell 11 of which the equalizing circuit is activated has not exceeded the threshold V_ab2, the controller 50 makes normal determination that there is no leakage abnormality in the corresponding Zener diode D (there is no abnormality in the corresponding protection circuit) (S106). After that, step S104 to step S106 are repeatedly executed until the equalizing process is ended (S107).

On the other hand, when the controller 50 determines in step S105 that the voltage difference between the voltage value of the single cell 11 of which the equalizing circuit is not activated and the voltage value of the single cell 11 of which the equalizing circuit is activated has exceeded the threshold V_ab2, the controller 50 makes abnormality determination that there is a leakage abnormality in the Zener diode D corresponding to the single cell 11 of which the equalizing circuit is not activated (there is an abnormality in the corresponding protection circuit) (S108). After that, the equalizing process is ended.

In step S108, the controller 50 is able to execute alarm process for informing a user, or the like, through lighting of an alarm lamp or output of a message, or the like, via voice or a display unit as a result of leakage abnormality determination of the Zener diode D.

In this way, according to the present embodiment, it is possible to detect an abnormality with a simple configuration without providing another abnormality detection switching element, or the like, in order to detect an abnormality in the protection circuits. Furthermore, it is possible to detect an abnormality of an element that is used in each protection circuit, such as a Zener diode other than the switching element.

Particularly, in the present embodiment, only by setting the resistance value of the resistor R21 (or the resistor R22) used in each equalizing circuit such that the resistance value of the resistor R21 (or the resistor R22) is larger than the resistance value of each resistor R11 used in each protection circuit, it is possible to detect a leakage abnormality in the Zener diodes. Thus, it is possible to easily implement detection of a leakage abnormality in the Zener diodes only by replacing existing resistors of a battery system including the protection circuits and the equalizing circuits. That is, it is not necessary to add an additional abnormality detection element or change an existing circuit configuration in order to detect a leakage abnormality in the Zener diodes. Thus, it is possible to obtain extremely high advantageous effects in detection of a leakage abnormality in the Zener diodes and the flexibility of design of the battery system overall.

In the above-described embodiment, the voltage monitoring unit 40 outputs the voltage of each of the plurality of single cells 11 to the controller 50 with the use of the single comparator 41. However, for example, it is applicable that the comparator 41 is provided in correspondence with each of the single cells 11 and the voltage of each of the single cells 11 is separately output from each comparator 41 to the controller 50.

What is claimed is:

1. An electrical storage system comprising:
a plurality of serially connected electrical storage blocks each including at least one electrical storage element connected to a load and configured to be charged or discharged;
a voltage detection circuit connected to each of the electrical storage blocks via corresponding voltage detection lines and configured to detect a voltage of each of the electrical storage blocks;
a protection circuit including an overvoltage protection element connected in parallel with each of the electrical storage blocks via the corresponding voltage detection lines and a first resistor connected in series with the overvoltage protection element, and the protection circuit being provided in correspondence with each of the electrical storage blocks;
a discharge circuit connected in parallel with each of the overvoltage protection elements via the corresponding voltage detection lines and connected in series with the first resistor, the discharge circuit including a second resistor having a larger resistance value than the first resistor; and
a controller configured to compare a voltage between the electrical storage blocks using the detected voltages of the corresponding voltage detection circuits and detect an abnormality in the overvoltage protection elements, wherein
the controller is configured to detect an abnormality in the overvoltage protection elements by, in a state where the electrical storage elements are not connected to the load, comparing a voltage of a first electrical storage block among the electrical storage blocks, which is placed in a discharged state where current is caused to flow through the corresponding second resistor by activating the corresponding discharge circuit, with a voltage of a second electrical storage block among the electrical storage blocks, which is not placed in the discharged state caused by activating the corresponding discharge circuit.

2. The electrical storage system according to claim 1, wherein
the controller is configured to execute equalizing process for equalizing voltages of the electrical storage blocks by activating the discharge circuits in a state where the electrical storage elements are not connected to the load, obtain a voltage difference from the voltage of the first electrical storage block and the voltage of the second electrical storage block, which is detected at a predetermined interval during the equalizing process for decreasing the voltage of the first electrical storage block by activating the corresponding discharge circuit, and detect that the corresponding overvoltage protection element in the second electrical storage block is in an abnormal state when the voltage difference has exceeded a predetermined threshold.

3. The electrical storage system according to claim 1, wherein
each discharge circuit includes the second resistor and a switch connected in series with the second resistor.

4. The electrical storage system according to claim 1, wherein
each overvoltage protection element is a Zener diode.

* * * * *